United States Patent [19]
Brunel et al.

[11] Patent Number: 5,874,860
[45] Date of Patent: Feb. 23, 1999

[54] HIGH FREQUENCY AMPLIFIER AND CONTROL

[75] Inventors: Dominique Brunel, Toulouse; Jacques Trichet, Rousseau, both of France

[73] Assignee: Motorola, Inc., Schaumburg, Ill.

[21] Appl. No.: 758,832

[22] Filed: Dec. 4, 1996

[30]     Foreign Application Priority Data

Feb. 6, 1996 [FR] France ...................................... 9601392

[51] Int. Cl.[6] .................................................... H03G 3/20
[52] U.S. Cl. ........................... 330/285; 330/137; 330/140
[58] Field of Search .............................. 330/51, 127, 129, 330/130, 137, 140, 285

[56]              References Cited

U.S. PATENT DOCUMENTS

| | | | |
|---|---|---|---|
| 4,994,757 | 2/1991 | Bickley et al. | 330/285 |
| 5,371,478 | 12/1994 | Ueda | 330/285 |
| 5,640,693 | 6/1997 | Balch et al. | 455/127 |
| 5,642,378 | 6/1997 | Denheyer et al. | 375/216 |

*Primary Examiner*—Steven Mottola
*Attorney, Agent, or Firm*—Robert F. Hightower

[57]                ABSTRACT

A monolithic RF amplifier circuit (10) suitable for use in the 0.8–2 GHz frequency range comprises, on-chip (12'), a gateable oscillator (24) running at about 2–5 times the amplifier input frequency or higher, coupled to a rectifier (30) and a low pass filter (34) for producing a DC signal which is fed via a bias/gain control circuit (46) to a bias/gain inputs (56, 58) of one or more amplification stages (60, 62) (e.g. GaAs FET) to provide bias therefore to ensure safe operation, and a priority control circuit (42) responsive to the bias. The priority control circuit (42) operates a power switch (18) that couples the amplification stages (60,62) to a power supply, only when bias is present on their bias/gain inputs (56,58) This protects the amplification stages (60,62) against overcurrent operation. A separate external port (68) to the bias/gain control circuit (46) adjusts the magnitude of the bias to permit amplifier gain and power output to be adjusted. By gating the oscillator ON and OFF, high speed burst mode operation of the amplifier is achieved.

14 Claims, 2 Drawing Sheets

HIGH FREQUENCY AMPLIFIER AND CONTROL

FIELD OF THE INVENTION

The present invention concerns a high frequency amplifier and mean for controlling the amplifier, especially, in integrated circuit (IC) form.

BACKGROUND OF THE INVENTION

Field Effect transistors (FETs) and other semiconductor devices are much used as high frequency amplifiers. A non-limiting example of semiconductor device materials suitable for such applications is III–V semiconductor material, as for example, GaAs. Various types of semiconductor devices including FETs can be constructed in this and other semiconductor materials. Other non-limiting examples of semiconductor devices are MESFET, HEMT, PHEMT, MOSFET, JFET and Bipolar devices.

With FETs, it is often the case that such devices are depletion mode devices, that is, in the absence of applied bias, they are in a conductive or "ON" state and bias must be applied to the control terminal to control their conductance and turn them OFF. When they are operated as linear or quasi-linear amplifiers, especially when full drain swing is needed, it is usually necessary to provide a bias to the control terminal in order to ensure proper operation. A further difficulty is that when a voltage of a given polarity (e.g., positive) is to be applied to the device to provide power, the control bias required for proper operation must often be of the opposite polarity (e.g., negative). Thus, there is frequently a need to provide a control terminal bias supply having the opposite polarity than the main circuit supply. For convenience of explanation in describing the construction and operation of such amplifiers, and not intended to be limiting, it is assumed that the main circuit supply is positive and the bias supply is negative. Persons of skill in the art will understand that other choices of main circuit supply and bias supply polarity can also be made depending upon the types of devices being employed.

In many portable applications it is desired to operate from a single power supply. In this situation, if the main circuit supply is positive and the bias supply is negative, then the negative bias potential must be generated from the positive potential. In the prior art this has conventionally been done using charge pump system or an oscillator and rectifier arranged to produce a negative output. Unfortunately, these prior art charge pumps or oscillator-rectifier supplies have been relatively bulky and difficult or impossible to integrate, especially, on the same integrated circuit chip or other monolithic assembly as the amplifiers themselves. Thus, there continues to be a need for an improved negative bias supply for control of such high frequency amplifiers.

DETAILED DESCRIPTION OF THE DRAWINGS

Figure 1:
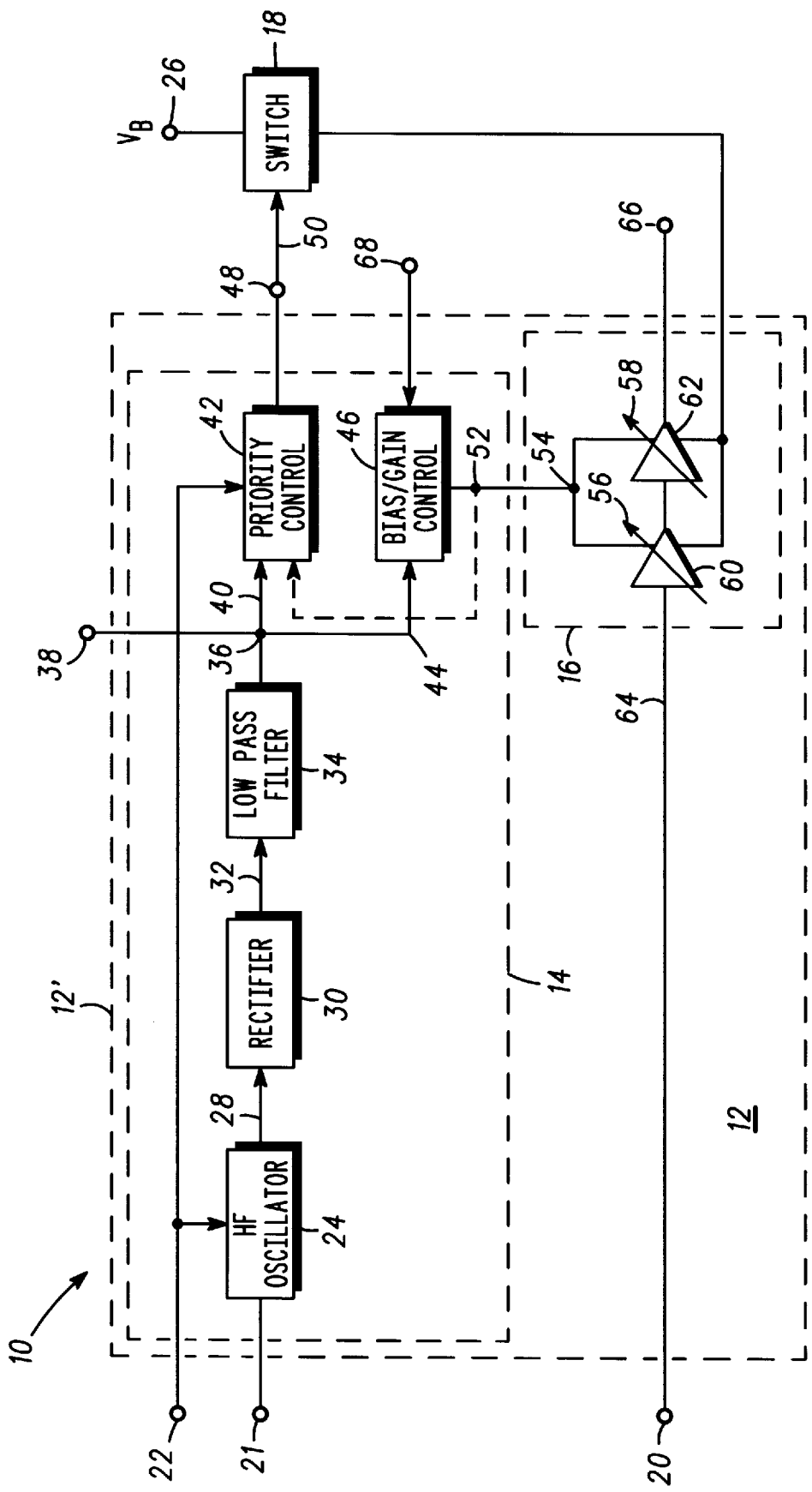
FIG. 1 shows a simplified schematic circuit diagram of an integrable high frequency amplifier with internal bias and control circuits, according to the present invention.

FIG. 1 shows a simplified schematic diagram of amplifier circuit 10 of integrable high frequency amplifier 12 with internal bias and control circuit 14 and amplifier element 16, coupled to power supply switch 18, according to the present invention. Dashed outline 12' surrounds the components that can be conveniently integrated in a single semiconductor micro-chip to provide integrated amplifier 12. The components within dashed outline 12' are particularly adapted to being provided within a single micro-circuit (IC) chip or monolithic microwave integrated circuit (MMIC), but this is not essential for the present invention and they can also be provided in an assembly.

Amplifier circuit 10 has RF input 20 through which RF signals of frequency $f_i$ intended to be amplified by amplifier element 16 of pass band $\Delta f$ are provided. For portable cellular phones and other mobile communication apparatus, $f_i$ is typically in the range of about 0.8 to 2 GHz or higher. Amplifier circuit 10 has ENABLE input 22 which controls operation of high frequency oscillator 24, as for example, to turn oscillator 24 ON and OFF, and to control priority control circuit 42. Oscillator 24 receives power via terminal 21 coupled to a power supply, e.g., a battery. It is desirable that oscillator 24 operate at high frequency, in particular at a frequency significantly higher than $f_i$, for example in the range of at least 2–5 times $f_i$. In a preferred embodiment where $0.8 < f_i < 2$ GHz, oscillator 24 operates at about 3–4 GHz or higher. It is important to operate oscillator 24 at such high frequency because it permits the use of very small elements for constructing oscillator 24, rectifier 30 and low pass filter 34. A further advantage is that spurious signals from oscillator 24 are further from the carrier $f_i$ and more easily filtered within the overall system. Thus, the possibility that intermodulation products of oscillator spurious signals and $f_i$ and harmonics fall into the system bandwidth is considerably reduced. It is important to be able to construct the circuit with elements of small physical size that are readily manufactured in integrated circuit form or are ordinarily present in a typical IC or MMIC structure. In this frequency range bonding wires have sufficient inductance to be used as inductive reactance. For example, bonding wire 27 in FIG. 2 can act as a tuning inductor for oscillator 24 without any need for external inductive components. Also, very small values of capacitance can be used which are easily fabricated using small amounts of chip area.

The oscillator can also operate at frequencies significant lower than $f_i$. In such a case the oscillator frequency must be high enough to switch the oscillator ON and OFF in the time required, especially when $f_i$ is higher than 5 GHz.

In addition, the oscillator can operate at the exact frequency $f_i$ when linked to the input signal by, for example, connecting terminal 21 to input 20 via an adequate matching circuitry. The oscillator is then synchronized on fi or simply acts as a buffer to amplify the incoming RF carrier. If the input signal swing is sufficient enough the oscillator (24) can even be unbiased. A minimum input power will however be required at pin 20 for proper operation which is not needed when the oscillator is free running (fosc≠fi).

Output 28 of oscillator 24 is fed to rectifier 30. Rectifier 30 is conveniently a two stage half-wave rectifier with the polarity of the diodes arranged so that a negative voltage appears on output 32 of rectifier 30 as for example to generate −6V DC from a +3.6 V DC power source at terminal 21. Other rectifying arrangements can also be used, provided that a voltage of the desired polarity appears on output 32. Output 32 is coupled to low pass filter 34 wherein the residual high frequency signal components from oscillator 24 and rectifier 30 are removed in a conventional manner. The negative DC output of low pass filter 34 is delivered to node 36. Node 36 is coupled to optional output terminal 38 where the negative voltage produced by oscillator 24, rectifier 30 and filter 34 appears and is available for use in other parts of the overall system (not shown).

Node 36 is coupled to input 40 of priority control circuit 42 and to input 44 of bias/gain control circuit 46. Output 48 of priority control circuit 42 is coupled to control input 50 of power supply switch 18. Output 52 of bias/gain control circuit 46 is coupled to node 54 which is in turn coupled to bias/gain inputs 56, 58 of amplification stages 60, 62 of amplifier element 16.

Amplifier element 16 is shown as comprising two serially coupled amplification stages 60, 62 but this is merely for purposes of illustration and amplifier element 16 can have more or fewer amplification stages and can employ serially coupled or feedback amplifying stages or a combination thereof and be of any convenient type compatible with the other components of integrated amplifier 12. Input 64 of amplifier element 16 is coupled to RF input 20 and signal $f_i$ in amplified form appears on output 66. Amplification stages 60, 62 can be grounded source or grounded gate stages, e.g., when FETs are used. Other configurations and device types useful for high frequency amplification can also be used. Amplification stages 60, 62 can consist of a single device or multiple devices or a combination thereof. Bias/gain inputs 56, 58 are coupled to the appropriate input terminal of device or devices 71, 72 (FIG. 2) so as to preclude amplifier element 16 carrying excess current when coupled to the power supply via power supply switch 18.

The function of priority control circuit 42 is to ensure that power switch 18 does not close, thereby coupling amplifier element 16 to battery Vb, until after bias/gain control circuit 46 has applied bias to bias/gain inputs 56, 58 of amplification stages 60, 62, and that power supply switch 18 opens before such bias is removed. This ensures that amplification stages 60, 62 are protected from electrical and thermal stress associated with uncontrolled (e.g., no-bias) operation. This can be accomplished in any number of ways, as for example (see FIG. 2) wherein a logical function is realized with two FETs and a output signal is provided to power switch 18 only when proper negative bias is present at node 36 is negative and ENABLE terminal 22 is positive. That prevents amplifier element 16 from carrying too much current.

Power supply switch 18 can be any convenient kind of device capable of coupling and decoupling power supply Vb appearing at terminal 26 to amplifier element 16. Power supply switch 18 need not be a very fast device, since its function is to apply and remove the power supply potential to and from amplifier element 16. It does not operate at frequency $f_i$ being amplified but, generally, at a much slower rate corresponding to the rate at which amplifier 12 is being turned on and off by a signal provided at ENABLE input 22. Where amplifier element 16 is formed from N-channel depletion mode FETs, then power supply switch 18 is conveniently a P-channel FET, or for example, a PMOS device, but other kinds of devices can also be used, e.g. PNP bipolar and N-channel normally-OFF-depletion MESFET. Where the IC fabrication technology being used to fabricate amplifier 12 permits devices of opposite types (e.g., P- and N- channel or PNP and NPN or a combination thereof, etc.) to fabricated in or on the same substrate then power supply switch 18 can also be integrated within amplifier 12, but this is not essential.

Another advantage of the present invention utilizing ultra-high frequency oscillator 24 is that a change in the signal at ENABLE input 22 produces a very rapid change in output of amplifier 12 since it only takes a few cycles of oscillator 24 before the effect of shutting off oscillator 24 by means of an appropriate signal removed from ENABLE input 22, is reflected in priority control circuit 42, thereby causing power supply switch 18 to turn OFF. For example, amplifier 12 of the present invention an be turned ON or OFF in less than 1 microsecond as compared to 200 microseconds for typical prior art amplifiers employing 100 kHz charge pumps to generate their negative bias voltage. This is a significant advantage in portable communications systems where it is desirable to conserve power by only turning on the RF power amplifier during very brief burst transmission and turning it off the remainder of the time. With the much slower reacting systems of the prior art, significant additional power is wasted during the much longer turn-ON, turn-OFF periods.

A still further advantage of the present invention utilizing ultra-high frequency oscillator 24 (i.e., 2–5×$f_i$, e.g., >3 GHz, preferably about 4 GHz or higher) as compared to the prior art techniques using 100 kHz charge pumps is that the ripple that remains on the DC potential on line 32 is small and relatively easily filtered away, and even if some remains, the modulation products produced in amplifier element 16 are sufficiently far away from $f_i$ that they are not within the pass-band of amplifier element 16. Thus, an electrically very clean output is achieved by amplifier 12.

In the case where fosc=fi, the situation is even simpler because absolutely no spurs will be generated since the RF carrier itself is used for the negative voltage generation.

The choice of fosc is therefore linked to the following point: if the input power of the amplifier (at pin 20) is constant or at least exceeds a given minimum value, then fosc=fi can be used which gives a spurless solution; on the other hand, if the input power varies over a large range (as for linear modulation with non-constant envelope), fosc≠fi is chosen having the oscillator free running.

The function of bias/gain control circuit 46 is to, for example, take the raw DC voltage appearing at node 36 and compensate for threshold variation of FETs of amplification stages 60, 62 and apply it to inputs 56, 58 of amplifier element 16. For example the bias/gain control circuit 46 allows a control signal (e.g. 0 to +2.7 volts) applied to terminal 68 to vary the bias applied at node 54 for setting the operating point of amplifiers 60, 62 to a range of about for example −5 to −2.3 volts for controlling their gain and operation, and therefor their power output.

This is important in cellular radio applications where the RF output power of the portable unit is monitored and adjusted depending upon the signal strength of the portable unit measured at the base station. This conserves power in the portable unit as well as reducing interference with neighboring cells. A preferred means of implementing bias/gain control circuit 46 is shown in FIG. 2 wherein depletion type FET 41 acts as a current source only if negative DC voltage from rectifier 30 appears at node 36 and that FET 41 and resistor 47 linearly transfer the voltage variation applied to external port 68 to the bias input of the amplification stages 60, 62 at node 54.

Figure 2:
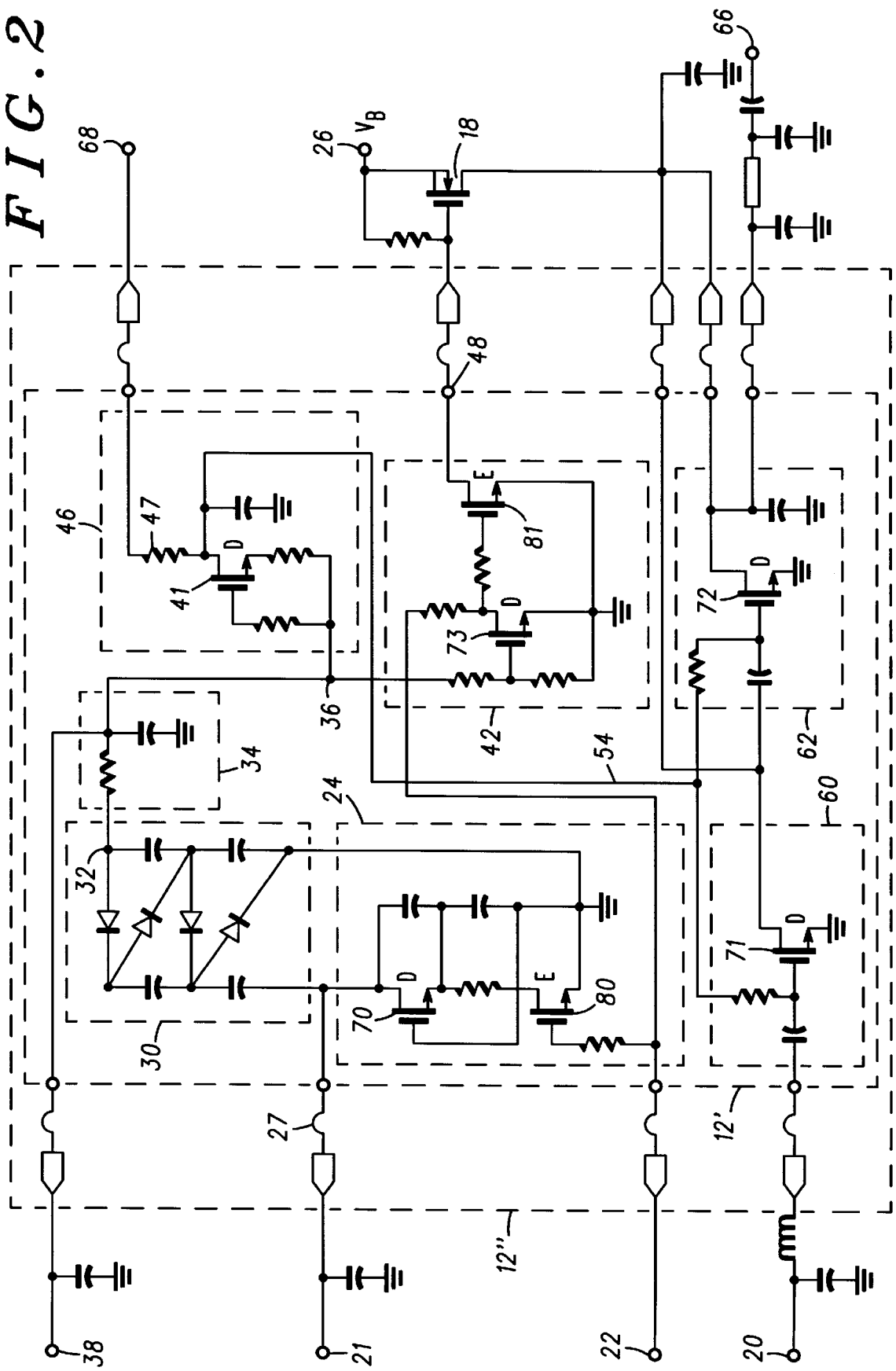
FIG. 2 shows the preferred embodiment of the amplifier of FIG. 1 incorporating further detail.

In the preferred embodiment of FIG. 2, transistors 41, 70, 71, 72 are depletion type FETs and transistors 80, 81 are enhancement type FETs and the other components shown are represented by conventional symbols. Dashed outline 12' indicates those components of amplifier 12 conveniently integrated within a monolithic semiconductor chip and dashed outline 12" indicates amplifier 12 after mounting in a device package.

Further, other arrangements can be used to achieve the same result. For example, and not intended to be limiting, optional line 55 (shown dashed in FIG. 1) can be provided between output 52 of bias/gain control circuit 46 and priority control circuit 42 to allow priority control circuit 42 to directly measure the voltage present at node 52.

Having thus described the invention, it will be apparent to those of skill in the art that the present invention provides an RF amplifier and bias and control circuit that is readily integrable, that can be made in extremely small size, that provides much faster response time than hitherto available, that includes inherent protection for depletion mode devices to prevent overload, that provides an output substantially free from spurious modulation caused by the negative bias supply, that needs few external components, that provides for variable power operation and that provides for lower overall power consumption in communication systems employing burst mode signaling.

We claim:

1. An amplifier circuit (10) comprising: a DC signal source; an amplification stave (60, 62) using a bias to achieve a predetermined operation; a bias/gain control circuit (46) for receiving the DC signal and providing the bias to the amplification stage (60, 62); and a priority control circuit (42) coupled to the DC source for ensuring that a power supply switch (18) coupling the amplification stage (60, 62) to a terminal (26) of a power supply is only turned ON when the bias is provided wherein gain of the amplification stage (60, 62) depends upon the bias/gain control circuit, wherein the amplifier further comprises an external port whereby the bias and the gain of the amplification stage (60, 62) can be varied.

2. An amplifier circuit (10) comprising: a DC signal source wherein the DC signal source comprises an oscillator (24) and a rectifier (30); an amplification stage (60, 62) using a bias to achieve a predetermined operation wherein the oscillator (24) operates at a frequency greater than about 2 times an operating frequency of the amplification stage (60, 62); a bias/gain control circuit (46) for receiving the DC signal and providing the bias to the amplification stage (60, 62); and a priority control circuit (42) coupled to the DC source for ensuring that a power supply switch (18) coupling the amplification stage (60, 62) to a terminal (26) of a power supply is only turned ON when the bias is provided.

3. The amplifier circuit (10) of claim 2 wherein the oscillator (24) operates at a frequency equal to or greater than about 2 GHz.

4. An amplifier circuit (10) comprising: a DC signal source wherein the DC signal source comprises an oscillator (24); an amplification stage (60, 62) using a bias to achieve a predetermined operation wherein the amplifier has a nominal operating frequency $f_i$ and a pass band $\Delta f$ and the oscillator operates at a frequency $f_0$ above or below $f_i$ such that no significant intermodulation products arising from $f_i$ and $f_0$ appear in the amplifier pass band $\Delta$; a bias/gain control circuit (46) for receiving the DC signal and providing the bias to the amplification stage (60, 62); and a priority control circuit (42) coupled to the DC source for ensuring that a power supply switch (18) coupling the amplification stage (60, 62) to a terminal (26) of a power supply is only turned ON when the bias is provided.

5. An amplifier circuit (10) comprising: a DC signal source wherein the DC signal source comprises an oscillator (24); an amplification stage (60, 62) using a bias to achieve a predetermined operation wherein the amplifier has a nominal operating frequency $f_i$ and a pass band $\Delta f$ and the oscillator operates at an frequency $f_0$ which is substantially equal to the nominal operating frequency fi; a bias/gain control circuit (46) for receiving the DC signal and providing the bias to the amplification stage (60, 62); and a priority control circuit (42) coupled to the DC source for ensuring that a sower supply switch (18) coupling the amplification stage (60, 62) to a terminal (26) of a power supply is only turned ON when the bias is provided.

6. The amplifier circuit (10) of claim 1 wherein the amplification stage (60, 62) comprises one or more normally ON depletion mode semiconductor devices.

7. The amplifier circuit (10) of claim 6 wherein the one or more semiconductor devices comprises an N-channel FET.

8. The amplifier circuit (10) of claim 7 wherein the FET is a GaAs FET.

9. A semiconductor based amplifier (12") for amplifying frequency $f_i$ when coupled to a power supply (Vb) and a power supply switch (18), CHARACTERIZED BY, an amplification stage (60, 62) for amplifying $f_i$ using a bias to achieve a predetermined operation, an oscillator (24) operating at more than about 2 times $f_i$ and coupled to a rectifier (30) for producing a DC signal, a bias/gain control circuit (46) for receiving the DC signal and providing the bias to the amplification stages (60, 62), and a priority control circuit (42) coupled to the oscillator (24) and rectifier (30), wherein the priority control circuit (42) operates to ensure that the power supply switch (18) coupling the amplification stage (60, 62) to the power supply (Vb) is only turned ON when the bias is provided.

10. The amplifier circuit of claim 9 wherein gain of the amplification stage (60, 62) depends upon the bias/gain control circuit, wherein the amplifier further comprises an external port whereby the bias and the gain of the amplification stage (60, 62) can be varied.

11. The amplifier circuit (10) of claim 9 wherein the oscillator (24) operates at a frequency equal to or greater than about 2 GHz.

12. The amplifier circuit (10) of claim 9 wherein the amplification stage (60, 62) comprises one or more normally ON depletion mode semiconductor devices.

13. The amplifier circuit (10) of claim 12 wherein the one or more semiconductor devices comprises an N-channel FET.

14. The amplifier circuit (10) of claim 13 wherein the FET is a GaAs FET.

* * * * *

UNITED STATES PATENT AND TRADEMARK OFFICE
CERTIFICATE OF CORRECTION

PATENT NO. : 5,874,860
DATED : February 23, 1999
INVENTOR(S) : Dominique Brunel et al.

It is certified that error appears in the above-identified patent and that said Letters Patent is hereby corrected as shown below:

<u>Column 5,</u>
Line 15, delete "stave" and add -- stage --.

<u>Column 6,</u>
Line 9, delete "fi" and add -- $f_i$ --.
Line 13, delete "sower" and add -- power --.

Signed and Sealed this

Twenty-first Day of May, 2002

*Attest:*

JAMES E. ROGAN
*Attesting Officer*     *Director of the United States Patent and Trademark Office*